United States Patent [19]

Yu et al.

[11] 4,045,727
[45] Aug. 30, 1977

[54] MICROWAVE PROXIMITY DETECTOR

[75] Inventors: Se Puan Yu; Gary H. Glover, both of Schenectady, N.Y.

[73] Assignee: General Electric Company, Schenectady, N.Y.

[21] Appl. No.: 667,271

[22] Filed: Mar. 15, 1976

[51] Int. Cl.² ............................................ G01R 27/04
[52] U.S. Cl. .................................................. 324/58.5 B
[58] Field of Search ........................ 324/58.5 B, 58 B; 343/12 R

[56] References Cited
U.S. PATENT DOCUMENTS 2,498,548  2/1950  Howard ...................... 324/58.5 B X

FOREIGN PATENT DOCUMENTS 1,016,784  1/1966  United Kingdom ............ 324/58.5 B
1,030,834  5/1966  United Kingdom ............ 324/58.5 B

*Primary Examiner*—Stanley T. Krawozewicz
*Attorney, Agent, or Firm*—Donald R. Campbell; Joseph T. Cohen; Jerome C. Squillaro

[57] ABSTRACT

A non-contacting method and apparatus for proximity detection with negligible radiation loss utilizes a microwave junction essentially having propagating waves on one side and evanescent electromagnetic fields on the other. Perturbation of the evanescent fields by an object causes a variation in the reflection coefficient of the propagation mode which is dependent on the distance from the junction to the object. This variation can be detected by measuring the phase shift of the propagating reflected waves relative to a reference.

12 Claims, 8 Drawing Figures

MICROWAVE PROXIMITY DETECTOR

BACKGROUND OF THE INVENTION

This invention relates to a non-contacting method and microwave apparatus for proximity detection, and more particularly to proximity detection based on the perturbation of evanescent electromagnetic fields by an object.

A variety of different types of proximity detectors are known, such as those based on capacitive effects. A particular application that requires a reliable, accurate, non-contacting technique for measuring relatively small distances at high temperatures is the measurement of clearances between the tips of rotating turbine blades and the casing in a jet engine. In a jet engine the blade tip-casing clearances must be kept small for high engine efficiency. It is desirable to monitor the separation as it may change catastrophically with thermal variations. For such jet engine applications, the difficulty with a microwave system in which the phase shift of a propagating wave reflected off the blade tips is measured is that such a scheme suffers from multiple reflections of waves propagating throughout the closed engine shell and finally returning to the receiver.

The present invention is directed to a microwave proximity detector with quantitative output that radiates an insignificant amount of electromagnetic energy, and to the associated non-contacting method for detecting relatively small separation distances which is especially useful in those environments where little or no radiation loss can be tolerated.

SUMMARY OF THE INVENTION

In accordance with the invention, a proximity detector is comprised by a microwave junction essentially having wave propagation on one side of the junction and evanescent electromagnetic fields on the other side. Perturbation of the evanescent or non-propagating fields by an object in proximity to the junction causes a measurable change in the reflection coefficient of the propagating mode which is dependent on the linear separation between the junction and object. Assuming that the reflection coefficient has unity magnitude, a microwave phase detector can be used having a quantitative output indicative of the proximity. In the preferred embodiment implemented with a rectangular waveguide system, the microwave junction is a waveguide iris diaphragm such as a resonant iris, and detector means are provided for detecting the magnitude of the phase shift of the propagating reflected waves relative to reference waves. A simple phase detector is comprised by a hybrid tee coupler having the microwave source coupled to one port, the iris and an adjustable short circuit coupled to opposing second and third ports, and a crystal diode detector coupled to the fourth port. Output means senses the voltage across the crystal diode to generate a quantitative output indicative of the junction-object distance, typically 0–100 mils for the turbine blade-casing clearance application.

A non-contacting method for detecting the distance from a reference position to an object as more broadly defined includes the steps of propagating incident waves through a transmission line to a microwave junction mounted at the reference position, perturbing the evanescent fields with a resulting variation in a selected parameter of the propagating reflected waves dependent on the separation between the reference position and object, and detecting the variation in the selected parameter and generating an output indicative of the distance from the reference position to the object.

DESCRIPTION OF THE PREFERRED EMBODIMENTS

Figure 1:
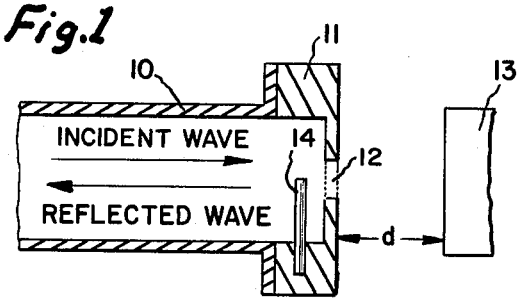
FIG. 1 is a schematic cross section of a portion of the microwave proximity detector useful in explaining the principles of the invention.
Figure 2:
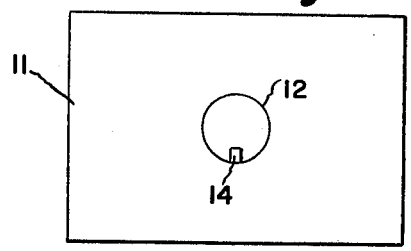
FIG. 2 is a plan view of the waveguide iris and adjustment post illustrated in FIG. 1.

The principles underlying the invention can be understood by reference to the showing in FIGS. 1 and 2 of the main features of the microwave proximity detector implemented with rectangular waveguide. A section of waveguide 10 with an end flange has mounted at its open end a waveguide iris diaphragm 11 with a circular or other appropriately shaped aperture 12. The outer major surface of the waveguide diaphragm exposed to free space establishes a reference position for the detection and measurement of the linear distance, $d$, to an object 13 in proximity to the microwave junction. The object is usually made of conductive or dielectric material but in any event does not have a substantial lossy component. Assuming a source of microwave energy is provided to supply propagating incident electromagnetic waves through waveguide 10, the character of waveguide iris diaphragm 11 is such as to produce propagating reflected waves on one side of the diaphragm and evanescent or non-propagating electromagnetic fields on the other side of the diaphragm. Although not essential, an adjustable capacitive post 14 can be mounted on the diaphragm to provide a variable coupling of the energy to aperture 12. While a small amount of propagating mode energy may radiate into free space, most of the energy is reflected back.

Perturbation of the evanescent electromagnetic fields by a conductive or dielectric object causes changes in the reflection coefficient, $\rho$, of the propagating mode energy which can be related to the proximity of the object to the microwave junction. Very little energy is lost in view of the fact that the evanescent field structure is essentially electrostatic, and furthermore the reflection coefficient is substantially unchanged by perturbations far from the junction. That is, the object changes the electric and/or magnetic field configuration on the stationary field side of the junction, thereby resulting in a variable change in the susceptance provided in shunt with the transmission line by the microwave junction. Accordingly, a microwave proximity detector and non-contacting method of detecting the distance from a reference position to the object can be based on detecting the magnitude of the variation in a selected parameter of the propagating reflected waves caused by perturbation of the evanescent magnetic fields by an object in proximity to the microwave junction. In the usual case, as is the case with the waveguide iris diaphragm in FIG. 1, the reflection coefficient of the propagating mode has a near unity magnitude, but the phase varies continuously with the distance from the reference position so that a microwave phase detector is sufficient to determine the proximity quantitatively.

Figure 3:
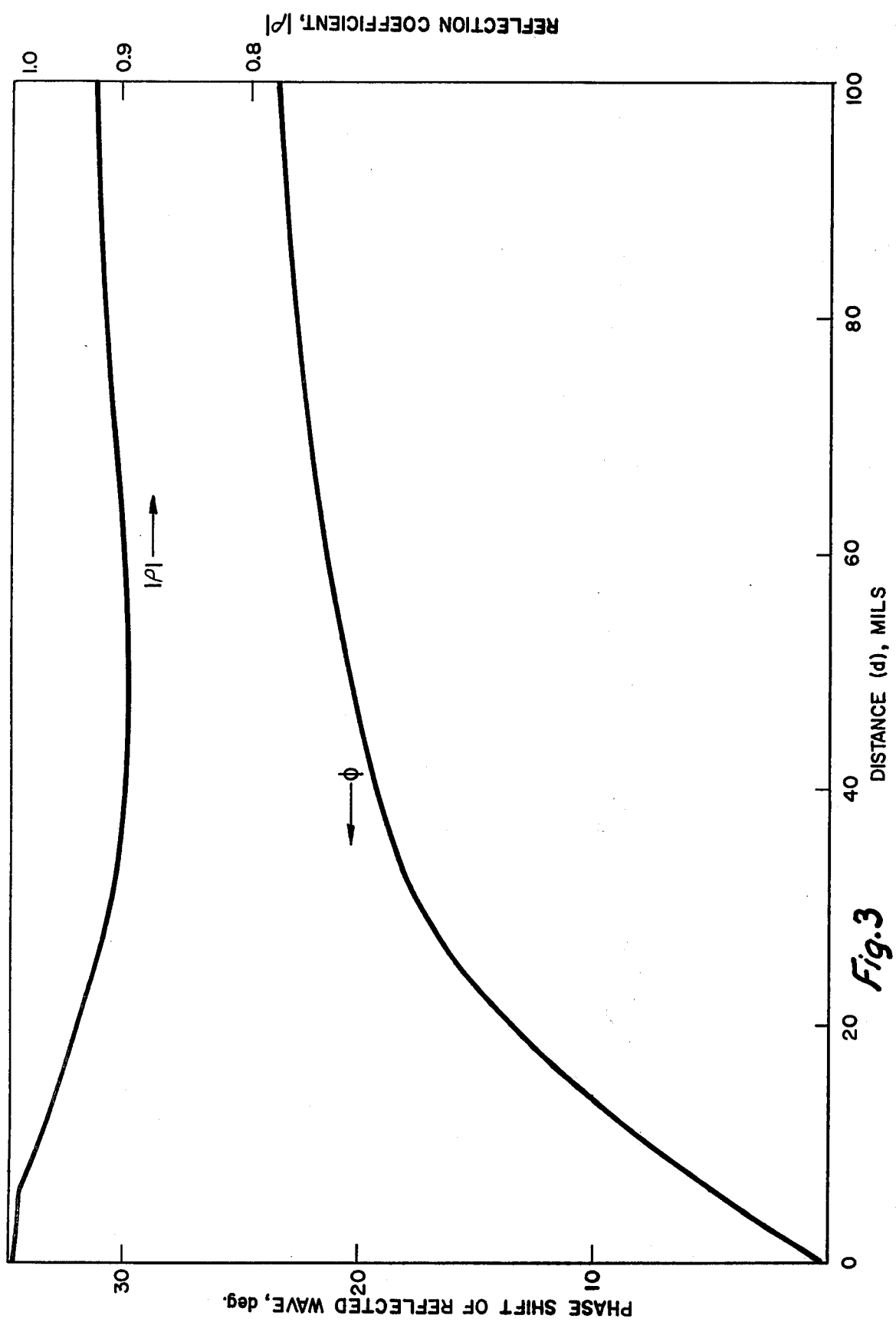
FIG. 3 shows plots of the absolute value of the reflection coefficient, $|\rho|$, versus separation distance, $d$, and of phase shift in degrees of the reflected wave versus separation distance, for the apparatus in FIG. 1.

FIG. 3 shows typical experimental data on the measured reflection coefficient for a microwave proximity detector as shown in FIGS. 1 and 2 using X band waveguide 10 with a post-coupled waveguide iris diaphragm 11 having an aperture 12 with a diameter of 0.200 inches. The source was a laboratory generator with a frequency of 10.85 GHz, and object 13 was a square metallic plate. A commercially available network analyzer was used to measure the absolute magnitude of the reflection coefficient, $|\rho|$, and the phase shift of the reflected waves, $\phi$, both with respect to the distance in mils, $d$. The magnitude of the reflection coefficient varies somewhat between 1.0 and 0.9 but can be said to be relatively constant. On the other hand, the phase shift of the propagating reflected waves continuously increases as the distance, $d$, is increased from 0 to 100 mils. The variation in phase is substantially linear in the range of 0-40 mils, and there is sufficient sensitivity to derive a useful quantitative output and measure of linear separation in the range of 0-60 mils.

Within the scope of the invention as more broadly defined, various types of microwave transmission lines and microwave junctions can be employed in constructing the apparatus and practicing the non-contacting method of measuring relatively short distances to an object, providing the microwave junction is capable of essentially producing propagating reflected waves on one side of the junction and evanescent electromagnetic fields on the other side. It has been found that a coaxial line system is good for detecting distances less than approximately 30 mils, while straight circular waveguide may require a rectangular aperture to remedy the problem of ambiguous polarization of the fields. Instead of generating a quantitative output indicative of the actual distance between the reference position and object, a qualitative output indicating that the object has moved closer than a given distance is also possible. There are many applications for microwave proximity detection as herein described, but the invention is most advantageous for those applications where a relatively small distance to an object needs to be measured with high resolution and without radiating a significant amount of energy. A detector can be used in a closed system without loss of accuracy which might occur if there were multiple reflections of radiated energy by the walls of the closed system.

Figure 5:
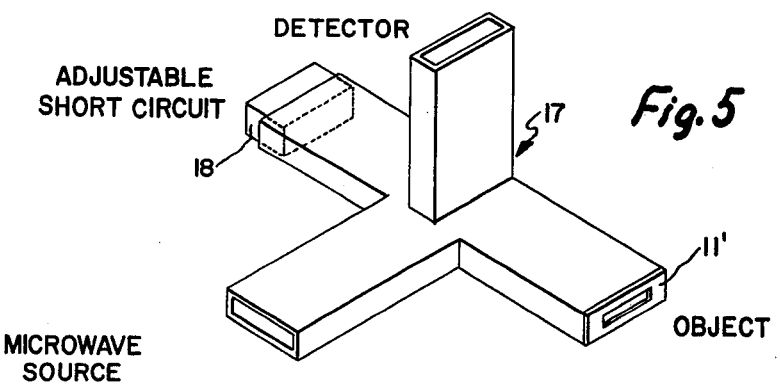
FIG. 5 is a schematic perspective of a rectangular waveguide hybrid coupler employed as a low cost phase detector in a microwave proximity detector according to the preferred embodiment of the invention.
Figure 4:
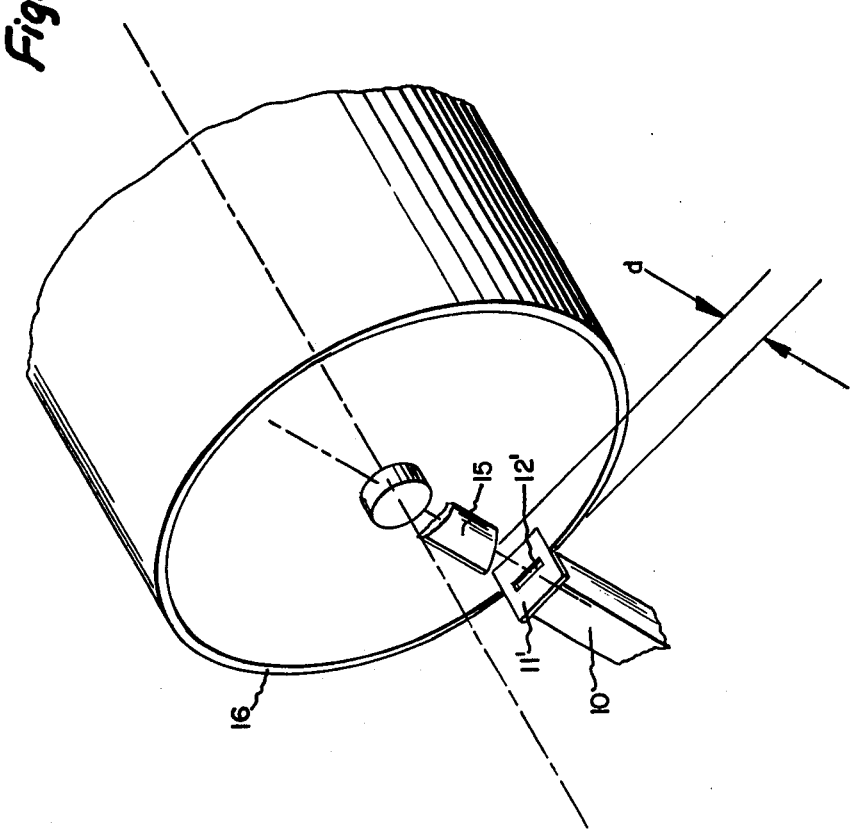
FIG. 4 is a schematic isometric view, with portions broken away, of the proximity detector used as factory instrumentation for the monitoring and measurement of casing-blade tip separation.

Referring to FIG. 4, an exemplary application is the measurement of clearances between the tips of rotating turbine blades and the inner wall of the stationary turbine casing in a jet engine. It is important to keep this clearance small to attain high engine efficiency, and in addition dynamic measurements are required because the clearance will change with temperature and time. In actual factory instrumentation it may be desirable to use four proximity detectors at 90° intervals, but the sensing arm of only one proximity detector is illustrated with a resonant waveguide iris 11' having a rectangular slot aperture 12' to provide high phase sensitivity. The front surface of resonant iris 11' establishing the reference position is coplanar with the inner wall of casing 16, and a fragmentary portion of only a single turbine blade 15 is illustrated. Jet engine turbines operate at high temperatures and the blade-casing clearance at a given location may change catastrophically with thermal variations. A simple, low cost phase detector for a rectangular waveguide system includes a four-port, hybrid tee coupler 17 (see FIG. 5) and a crystal diode detector. One port of the hybrid tee junction is coupled to a microwave power source such as a low power Gunn diode oscillator, while the opposing second and third ports in the colinear arms are respectively coupled to resonant waveguide iris 11' and an ajustable short circuit device 18. With this arrangement as is well known in the art, propagating incident waves generated by the microwave source and fed to the shunt arm are divided equally between the two colinear arms. Ideally none of the incident electromagnetic waves are fed through the fourth port to the crystal diode detector placed in the series arm.

Figure 6:
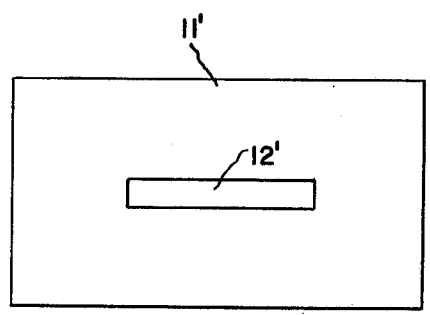
FIG. 6 is a plan view of the resonant waveguide iris shown in FIG. 5.

Assuming that the dimensions for resonant aperture 12' (see FIG. 6) are properly selected as taught by the prior art, such a self-resonant aperture placed over the open end of the waveguide greatly improves the phase sensitivity. The equivalent circuit of resonant waveguide iris 11' is a parallel resonant circuit in shunt with the transmission line. By moving the object into proximity with the self-resonant diaphragm and thereby perturbing the evanescent electromagnetic fields, the effect is to detune the resonant waveguide iris by altering the equivalent shunt capacitance or inductance. As compared to the post-coupled iris in FIG. 1 used to minimize energy propagation into the turbine cavity, the self-resonant diaphram allows a small amount of energy to enter the cavity and effect a larger phase shift at larger distances from the reference position. This is further discussed with regard to FIG. 8.

Figure 7:
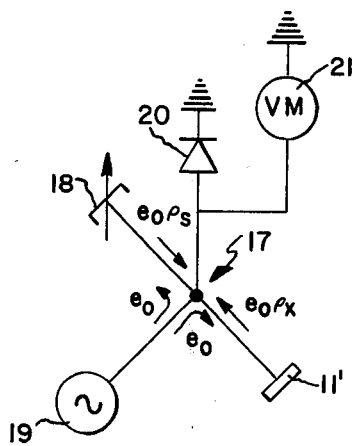
FIG. 7 is an equivalent circuit diagram of the apparatus with hybrid coupler shown in FIG. 5.

Referring to FIG. 7, microwave source 19 has a frequency corresponding to the resonant frequency of resonant waveguide iris 11' and, as was mentioned previously, generates incident energy that splits evenly between the second and third ports. Reflected waves from resonant waveguide iris 11' and from adjustable short circuit device 18 interfere and propagate through the fourth port of hybrid tee coupler 17 and are detected by crystal diode 20. The mounting of crystal diode 20 to the fourth arm of the hybrid tee coupler is conventional and is not illustrated. In this simple phase detector the adjustable short circuit device 18 maximizes the power into the crystal detector to generate a maximum unidirectional output signal representative of the phase difference between the two interfering waves, one of which is a reference standard wave while the other is the unknown. More particularly, the crystal detector output voltage is given by the equation $V = k e_o |\rho_x - \rho_s|^2$, where $e_o$ is the split source signal, $\rho_x$ is the reflection coefficient of the unknown (iris 11'), $\rho_s$ is the reflection coefficient of the standard, and $k$ is a constant of the detector.

Figure 8:
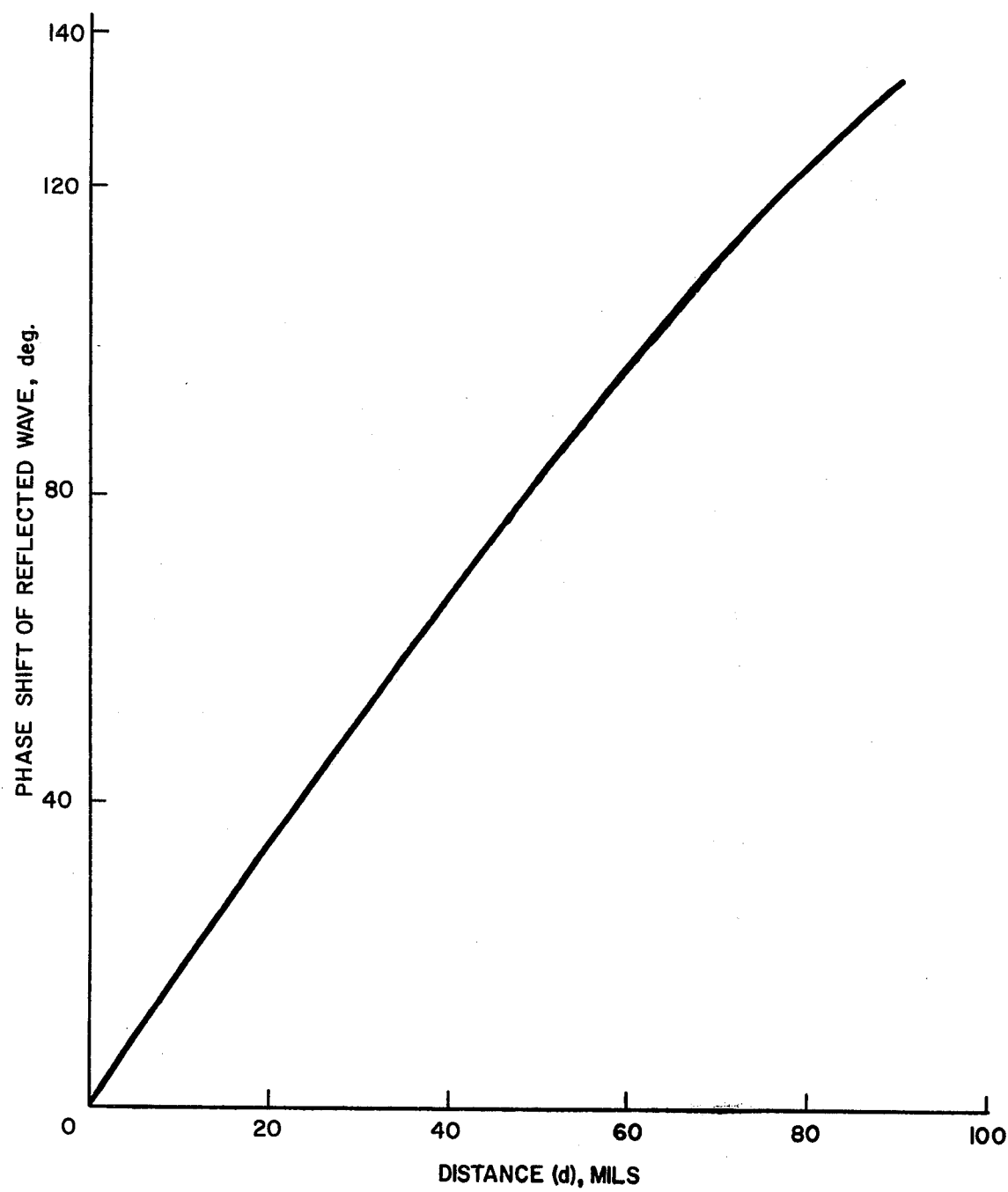
FIG. 8 is a plot of phase shift in degrees of the reflected wave versus separation distance for the embodiment of FIGS. 5–7.

Accordingly, a quantitative output indicative of the distance from resonant waveguide iris 11' to the object is generated by a voltmeter 21 or other output means connected to sense the voltage across crystal diode 20. As is seen in FIG. 8, a relatively linear phase shift-distance characteristic with good measurement sensitivity over a range of 0–100 mils is obtained with a microwave proximity detector having a self-resonant diaphragm. The detector shown in FIG. 7 can be constructed with X band waveguide, and if desired the section of waveguide adjacent resonant iris 11' can be filled with a low loss dielectric material to provide a dielectric window between the waveguide and the hot gases in the turbine. In one microwave proximity detector which was constructed with a resonant window to provide high phase sensitivity, a resolution of 2 mils over the range of 0–100 mils was observed.

While the invention has been particularly shown and described with reference to several preferred embodiments thereof, it will be understood by those skilled in the art that various changes in form and details may be made therein without departing from the spirit and scope of the invention.

The invention claimed is:

1. A non-contacting method of detecting the distance from a reference position to an object comprising the steps of propagating incident microwave frequency electromagnetic waves through a transmission line to a microwave junction mounted at a reference position to essentially produce propagating reflected waves on one side of the junction and evanescent electromagnetic fields on the other side of the junction, perturbing the evanescent electromagnetic fields with a resultant variation in a selected parameter of the reflected waves dependent on the linear separation between the reference position and an object in proximity to the microwave junction, and detecting the variation in the selected reflected wave parameter and generating an output indicative of the distance from the reference position to the object.

2. The method defined in claim 1 wherein the step of detecting the variation in the selected reflected wave parameter and generating an output comprises deriving reference waves from said incident waves, and effectively comparing the selected parameters of the reflected and reference waves and deriving as the output a quantitative output representative of the difference therebetween.

3. A non-contacting method of detecting the distance from a reference position to an object comprising the steps of propagating incident microwave frequency electromagnetic waves through a transmission line to a microwave junction mounted at a reference position to essentially produce propagating reflected waves on one side of the junction and evanescent electromagnetic fields on the other side of the junction, perturbing the evanescent electromagnetic fields and causing a resultant variable phase shift of the reflected waves dependent upon the linear separation between the reference position and an object in proximity to the microwave junction, and detecting the magnitude of the phase shift of the reflected waves relative to a reference and generating a quantitative output indicative of the distance from the reference position to the object.

4. The method defined in claim 3 wherein the step of detecting the phase shift and generating a quantitative output comprises deriving reference waves from said incident waves, and interfering the reflected and reference waves and producing a unidirectional output signal representative of the phase difference between the two interfering waves and thus of the distance from the reference position to the object.

5. A microwave proximity detector comprising a source of microwave energy for supplying incident waves that propagate through a transmission line, said transmission line having at one end thereof a microwave junction capable of essentially producing propagating reflecting waves on one side of the junction and evanescent electromagnetic fields on the other side of the junction, detector means for detecting the magnitude of the variation in a selected parameter of the reflected waves caused by perturbation of the evanescent electromagnetic fields by an object in proximity to the microwave junction in dependence upon the linear separation therebetween, and output means for generating an output indicative of the distance from the microwave junction to the object.

6. The proximity detector defined in claim 5 wherein said transmission line is a rectangular waveguide and said microwave junction is a waveguide iris diaphragm.

7. The proximity detector defined in claim 6 wherein said waveguide iris diaphragm is a resonant waveguide iris, and said microwave energy source has a frequency corresponding to the resonant frequency of said resonant waveguide iris.

8. The proximity detector defined in claim 6 wherein said detector means is a phase detector for determining the difference in phase between the reflected waves and reference waves derived from said incident waves, said phase detector being comprised by a crystal diode for producing a variable unidirectional output signal representative of the phase difference, and said output means is a voltmeter connected to sense the voltage across said crystal diode and thereby generate a quantitative output indicative of the distance from the microwave junction to the object.

9. A microwave proximity detector comprising a source of microwave energy for supplying incident waves that propagate through a waveguide system, said waveguide system having an open end at which is mounted a waveguide iris diaphragm for essentially producing propagating reflected waves at one side of the diaphragm and evanescent electromagnetic fields on the other side of the diaphragm, detector means for detecting the magnitude of the phase shift of the reflected waves caused by perturbation of the evanescent electromagnetic fields by an object in proximity to the waveguide diaphragm in dependence upon the linear separation therebetween, and output means for generating a quantitative output indicative of the distance from the waveguide diaphragm to the object.

10. The proximity detector defined in claim 9 wherein said waveguide diaphragm is a resonant waveguide iris, and said source of microwave energy has a frequency corresponding to the resonant frequency of said resonant waveguide iris.

11. The proximity detector defined in claim 10 wherein said waveguide system includes a four-port hybrid tee coupler in which said source is coupled to the first port, said waveguide diaphragm is coupled to the second port, an adjustable short circuit device is coupled to the third port, and said detector means is coupled to the fourth port, whereby the incident waves are split between the second and third ports while the reflected waves from the waveguide diaphragm and adjustable short circuit device interfere and propagate through the fourth port to said detector means.

12. The proximity detector defined in claim 11 wherein said detector means is a crystal diode for producing a unidirectional output signal indicative of the phase shift of the reflected waves from said waveguide diaphragm, and said output means is a voltmeter connected to sense the voltage across said crystal diode and thereby generate a quantitative output indicative of the distance from the waveguide diaphragm to the object.

* * * * *